US005308442A

United States Patent [19]

[11] Patent Number: 5,308,442

[45] Date of Patent: May 3, 1994

Taub et al.

[54] ANISOTROPICALLY ETCHED INK FILL SLOTS IN SILICON

[75] Inventors: Howard H. Taub, San Jose; Joan P. Gallicano, Fremont, both of Calif.

[73] Assignee: Hewlett-Packard Company, Palo Alto, Calif.

[21] Appl. No.: 9,181

[22] Filed: Jan. 25, 1993

[51] Int. Cl.[5] ........................ H01L 21/306; B44C 1/22; C03C 15/00

[52] U.S. Cl. .................................... 156/644; 156/647; 156/657; 156/659.1; 156/662

[58] Field of Search ............... 156/643, 644, 647, 653, 156/656, 657, 659.1, 661.1, 662; 346/140 R

[56] References Cited

U.S. PATENT DOCUMENTS

| | | | |
|---|---|---|---|
| Re. 32,572 | 1/1988 | Hawkins et al. | 156/626 |
| 4,601,777 | 7/1986 | Hawkins et al. | 156/626 |
| 4,612,554 | 9/1986 | Poleshuk | 346/140 R |
| 4,638,337 | 1/1987 | Torpey et al. | 346/140 R |
| 4,789,425 | 12/1988 | Drake et al. | 156/644 |
| 4,829,324 | 5/1989 | Drake et al. | 346/140 R |
| 4,851,371 | 7/1989 | Fisher et al. | 437/226 |
| 4,863,560 | 9/1989 | Hawkins | 156/644 |
| 4,875,968 | 10/1989 | O'Neill et al. | 156/633 |
| 4,882,595 | 11/1989 | Trueba et al. | 346/140 R |
| 4,899,178 | 2/1990 | Tellier | 346/140 R |
| 4,899,181 | 2/1990 | Hawkins et al. | 346/140 R |
| 5,131,978 | 7/1992 | O'Neill | 156/653 |
| 5,141,596 | 8/1992 | Hawkins et al. | 156/644 X |

OTHER PUBLICATIONS

K. E. Bean, "Anisotropic Etching of Silicon", *IEEE Transactions on Electron Devices,* vol. ED-25, No. 10, pp. 1185-1192 (Oct. 1978).

K. L. Petersen, "Silicon as a Mechanical Material", in *Proceedings of the IEEE,* vol. 70, No. 5, pp. 420-457 (May 1982).

E. Bassous, "Fabrication of Novel Three-Dimensional Microstructures by the Anisotropic Etching of (100) and (110) Silicon", *IEEE Transactions on Electron Devices,* vol. ED-25, No. 10, pp. 1178-1185 (Oct. 1978).

*Primary Examiner*—William Powell

[57] ABSTRACT

An ink fill slot 18 can be precisely manufactured in a substrate 12 utilizing photolithographic techniques with chemical etching. N-type <100> silicon wafers are double-side coated with a dielectric layer 26 comprising a silicon dioxide layer and/or a silicon nitride layer. A photoresist step, mask alignment, and plasma etch treatment precede an anisotropic etch process, which employs an anisotropic etchant for silicon such as KOH or ethylene diamine para-catechol. The anisotropic etch is done from the backside 12*b* of the wafer to the frontside 12*a*, and terminates on the dielectric layer on the frontside. The dielectric layer on the frontside creates a flat surface for further photoresist processing of thin film resistors 16.

10 Claims, 4 Drawing Sheets

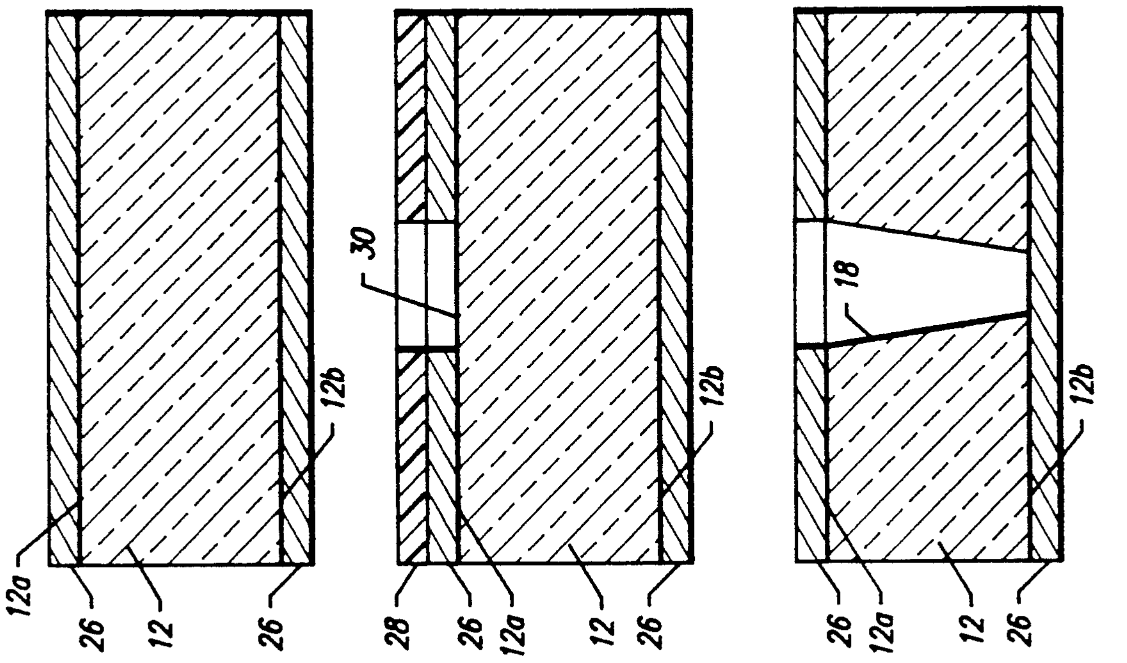
FIG. 4a
FIG. 4b
FIG. 4c
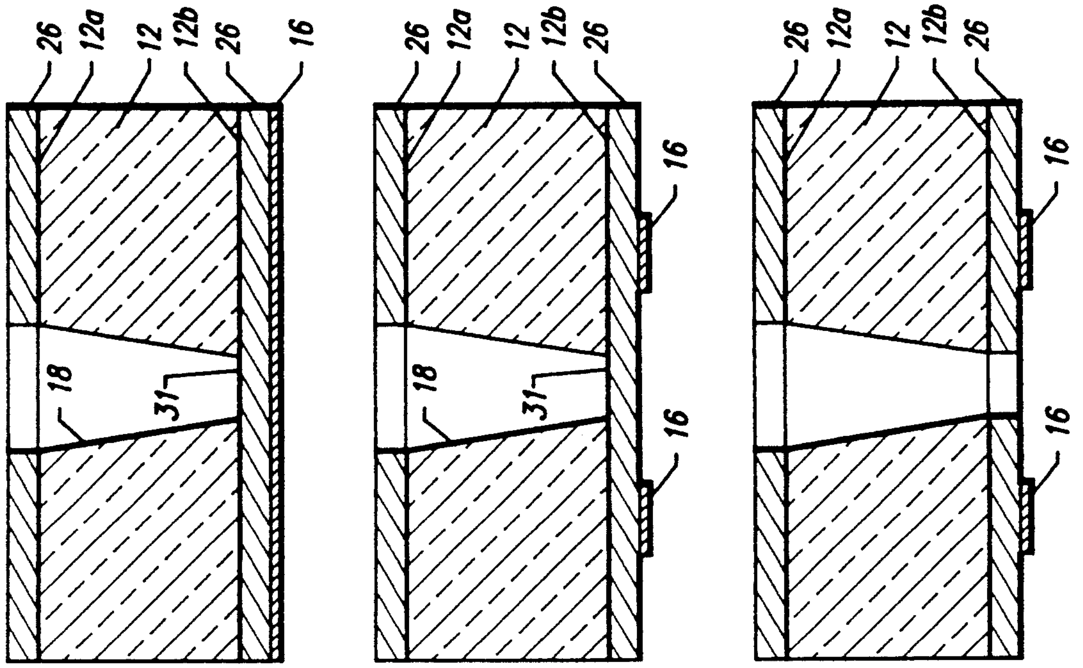
FIG. 4d
FIG. 4e
FIG. 4f

ANISOTROPICALLY ETCHED INK FILL SLOTS IN SILICON

CROSS-REFERENCE TO RELATED APPLICATIONS

The present application is related to application Ser. No. 07/845,882, filed on Mar. 4, 1992, entitled "Compound Ink Feed Slot" and assigned to the same assignee as the present application. The present application is also related to application Ser. No. 08/009,151, filed on even date herewith, entitled "Fabrication of Ink Fill Slots in Thermal Ink-Jet Printheads Utilizing Chemical Micromachining" and assigned to the same assignee as the present application.

TECHNICAL FIELD

The present invention relates to thermal ink-jet printers, and, more particularly, to an improved printhead structure for introducing ink into the firing chambers.

BACKGROUND ART

In the art of thermal ink-jet printing, it is known to provide a plurality of electrically resistive elements on a common substrate for the purpose of heating a corresponding plurality of ink volumes contained in adjacent ink reservoirs leading to the ink ejection and printing process. Using such an arrangement, the adjacent ink reservoirs are typically provided as cavities in a barrier layer attached to the substrate for properly isolating mechanical energy to predefined volumes of ink. The mechanical energy results from the conversion of electrical energy supplied to the resistive elements which creates a rapidly expanding vapor bubble in the ink above the resistive elements. Also, a plurality of ink ejection orifices are provided above these cavities in a nozzle plate and provide exit paths for ink during the printing process.

In the operation of thermal ink-jet printheads, it is necessary to provide a flow of ink to the thermal, or resistive, element causing ink drop ejection. This has been accomplished by manufacturing ink fill channels, or slots, in the substrate, ink barrier, or nozzle plate.

Prior methods of forming ink fill slots have involved many time-consuming operations, resulting in variable geometries, requiring precise mechanical alignment of parts, and typically could be performed on single substrates only. These disadvantages make prior methods less desirable than the herein described invention.

For example, while sandblasting has been used effectively, it is difficult to create ink slot features that are relatively uniform and free of contamination. Photolithography quality depends greatly on surface conditions and flatness, both of which are very much affected by sandblasting.

Further, at higher frequencies of operation, the prior art methods of forming ink slots provide channels that simply do not have the capacity to adequately respond to ink volume demands.

Fabrication of silicon structures for ink-jet printing are known; see, e.g., U.S. Pat. Nos. 4,863,560, 4,899,181, 4,875,968, 4,612,554, 4,601,777 (and its reissue U.S. Pat. No. Re. 32,572), 4,899,178, 4,851,371, 4,638,337, and 4,829,324. These patents are all directed to the so-called "side-shooter" ink-jet printhead configuration. However, the fluid dynamical considerations are completely different than for a "top-shooter" (or "roof-shooter") configuration, to which the present invention applies, and consequently, these patents have no bearing on the present invention.

U.S. Pat. No. 4,789,425 is directed to the "roof-shooter" configuration. However, although this patent employs anisotropic etching of the substrate to form ink feed slots, it fails to address the issue of how to supply the volume of ink required at higher frequencies of operation. Further, there is no teaching of control of geometry, pen speed, or specific hydraulic damping control. Also, this reference requires a two-step procedure, in which alignment openings are etched for a short period of time so that only recesses are formed.

A need remains to provide a process for precisely fabricating ink fill slots in thermal ink-jet printheads in a batch-processing mode.

DISCLOSURE OF INVENTION

It is an advantage of the present invention to provide ink fill slots with a minimum of fabrication steps in a batch processing mode.

It is another advantage of the invention to provide precise control of geometry and alignment of the ink fill slots.

It is a still further advantage of the invention to provide ink fill slots appropriately configured to provide the requisite volume of ink at increasingly higher frequency of operation, up to at least 14 kHz.

It is yet another advantage of the invention to substantially form the ink fill slots while maintaining an approximately flat surface on the primary surface of the wafer in order to do precision photolithography on that surface.

In accordance with the invention, an ink fill slot is precisely manufactured in a substrate utilizing photolithographic techniques with chemical etching.

The improved ink-jet printhead of the invention includes a plurality of ink-propelling thermal elements, each ink-propelling element disposed in a separate drop ejection chamber defined by three barrier walls and a fourth side open to a reservoir of ink common to at least some of the elements, and a plurality of nozzles comprising orifices disposed in a cover plate in close proximity to the elements, each orifice operatively associated with an element for ejecting a quantity of ink normal to the plane defined by each element and through the orifices toward a print medium in predefined sequences to form alphanumeric characters and graphics thereon. Ink is supplied to the thermal element from an ink fill slot by means of an ink feed channel. Each drop ejection chamber may be provided with a pair of opposed projections formed in walls in the ink feed channel and separated by a width to cause a constriction between the plenum and the channel, and each drop ejection chamber may be further provided with lead-in lobes disposed between the projections and separating one ink feed channel from a neighboring ink feed channel. The improvement comprises forming the ink fill slot and the drop ejection chamber and associated ink feed channel on one substrate, in which the ink fill slot is primarily or completely formed by anisotropic etching of the substrate, employing chemical etching.

The method of the invention allows control of the ink feed channel length so that the device geometry surrounding the resistors are all substantially equivalent. By extending the ink fill slot to the pair of lead-in lobes, ink may be provided closer to the firing chamber.

The frequency of operation of thermal ink-jet pens is dependent upon the shelf or distance the ink needs to travel from the ink fill slot to the firing chamber, among other things. At higher frequencies, this distance, or shelf, must also be fairly tightly controlled. Through the method of the invention, this distance can be more tightly controlled and placed closer to the firing chamber, thus permitting the pen to operate at a higher frequency.

BRIEF DESCRIPTION OF THE DRAWINGS

FIGS. 4*a–f* are cross-sectional views, depicting an alternative sequence, in which anisotropic etching is done prior to forming the resistor elements of FIG. 1.

BEST MODES FOR CARRYING OUT THE INVENTION

Figure 1:
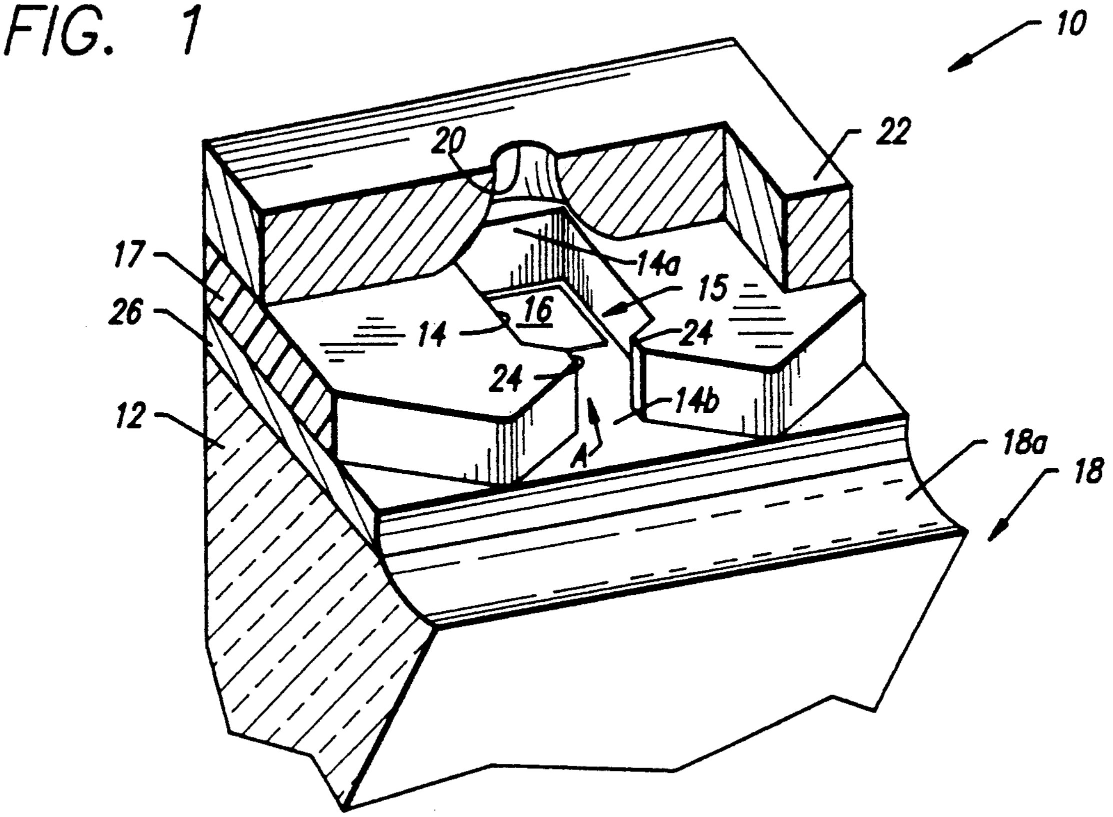
FIG. 1 is a perspective view of a resistor and ink feed channel in relation to an ink fill slot, or plenum, in accordance with the invention.
Figure 2:
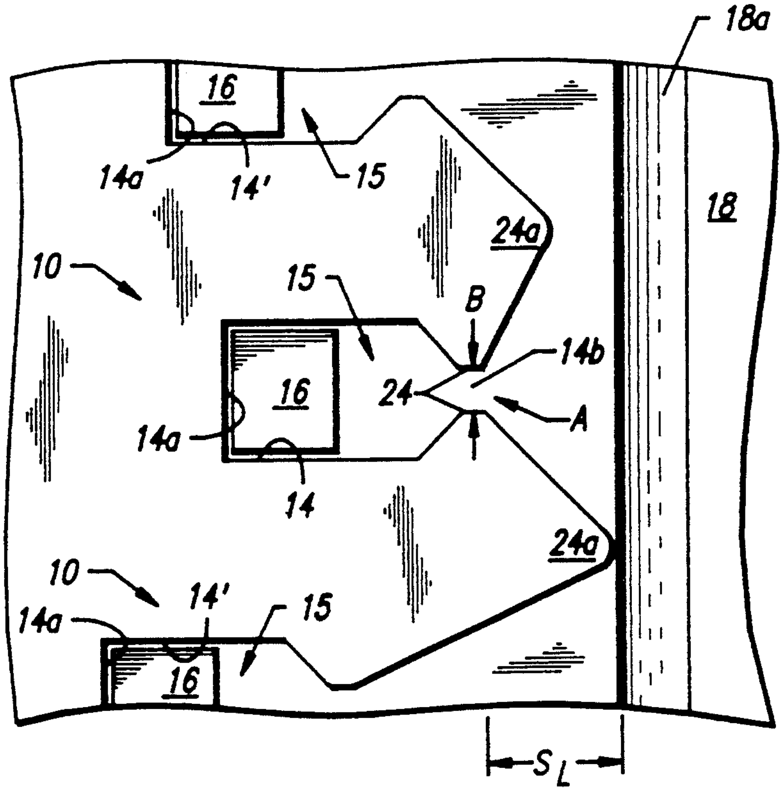
FIG. 2 is a top plan view of the configuration depicted in FIG. 1 and including adjacent resistors and ink feed channels, in which the shelf length is constant.
Figure 3:
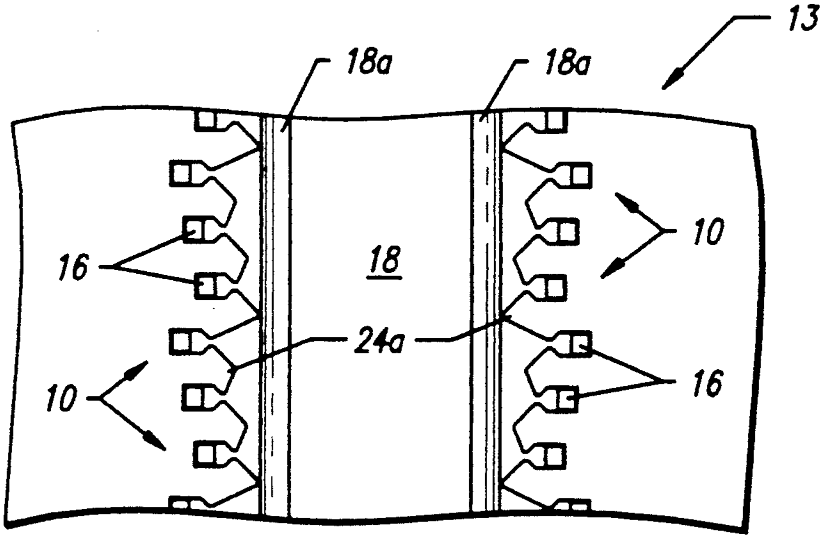
FIG. 3 is a top plan view of a portion of a printhead, showing one embodiment of a plurality of the configurations depicted in FIG. 2.

Referring now to the drawings where like numerals of reference denote like elements throughout, FIG. 1 depicts a printing or drop ejecting element 10, formed on a substrate 12. FIG. 2 depicts three adjacent printing elements 10, while FIG. 3 depicts a portion of a printhead 13 comprising a plurality of such firing elements and shows a common ink fill slot 18 providing a supply of ink thereto. While FIG. 3 depicts one common configuration of a plurality of firing elements, namely, two parallel rows of the firing elements 10 about a common ink fill slot 18, other configurations employed in thermal ink-jet printing, such as approximately circular and single row, may also be formed in the practice of the invention.

Each firing element 10 comprises an ink feed channel 14, with a resistor 16 situated at one end 14*a* thereof. The ink feed channel 14 and drop ejection chamber 15 encompassing the resistor 16 on three sides are formed in a layer 17 which comprises a photopolymerizable material which is appropriately masked and etched/developed to form the desired patterned opening.

Ink (not shown) is introduced at the opposite end 14*b* of the ink feed channel 14, as indicated by arrow "A", from an ink fill slot, indicated generally at 18. Associated with the resistor 16 is a nozzle, or convergent bore, 20, located near the resistor in a nozzle plate 22. Droplets of ink are ejected through the nozzle (e.g., normal to the plane of the resistor 16) upon heating of a quantity of ink by the resistor.

A pair of opposed projections 24 at the entrance to the ink feed channel 14 provide a localized constriction, as indicated by the arrow "B". The purpose of the localized constriction, which is related to improve the damping of fluid motion of the ink, is more specifically described in U.S. Pat. No. 4,882,595, and forms no part of this invention.

Each such printing element 10 comprises the various features set forth above. Each resistor 16 is seen to be set in a drop ejection chamber 15 defined by three barrier walls and a fourth side open to the ink fill slot 18 of ink common to at least some of the elements 10, with a plurality of nozzles 20 comprising orifices disposed in a cover plate 22 near the resistors 16. Each orifice 20 is thus seen to be operatively associated with an resistor 16 for ejecting a quantity of ink normal to the plane defined by that resistor and through the orifices toward a print medium (not shown) in defined patterns to form alphanumeric characters and graphics thereon.

Ink is supplied to each element 10 from the ink fill slot 18 by means of an ink feed channel 14. Each drop ejection chamber 15 is provided with a pair of opposed projections 24 formed in walls in the ink feed channel 14 and separated by a width "B" to cause a constriction between the ink fill slot 18 and the channel. Each firing element 10 may be provided with lead-in lobes 24*a* disposed between the projections 24 and separating one ink feed channel 14 from a neighboring ink feed channel 14'.

The improvement comprises a precision means of forming the ink fill slot 18 and associated ink feed channel 14 on one substrate 12.

In accordance with the invention, the ink fill slot 18 is precisely manufactured in a substrate 12 utilizing photolithographic techniques with chemical etching.

Representative substrates for the fabrication of ink fill slots 18 in accordance with the invention comprise single crystal silicon wafers, commonly used in the microelectronics industry. Silicon wafers with <100> or <110> crystal orientations are preferred. One method of ink fill slot fabrication consistent with this invention is detailed below, with reference to FIGS. 4*a–f*.

As shown in FIG. 4*a*, both sides 12*a*, 12*b* of silicon wafer 12, preferably oriented <100>, are coated with a dielectric coating 26, which serves as an etch stop layer. Although one layer of the coating 26 is depicted, two layers (not shown), one comprising silica and the other comprising silicon nitride, may alternately be employed. Silicon-based dielectric layers, such as silica and silicon nitride, are preferred, since their formation is well-known in the art.

The thickness of the $SiO_2$ layer is about 17,000 Å, while the thickness of the $Si_3N_4$ layer is about 2,000 Å. The two dielectric layers are formed by conventional methods.

Whether one or two dielectric layers are employed is related to the particular anisotropic etchant employed. The use of the anisotropic etchant is discussed in greater detail below. Briefly, potassium hydroxide and ethylene diamine para-catechol are used in etching silicon. Potassium hydroxide etches silicon dioxide rather rapidly, although slower than it etches silicon; it does not etch silicon nitride. Ethylene diamine para-catechol does not etch silicon dioxide. Also, silicon nitride tends to form a stressed layer, and a thicker layer of silicon nitride requires a layer of silicon dioxide as a stress-relieving layer. These considerations are discussed in greater detail by K. E. Bean, "Anisotropic Etching of Silicon", *IEEE Transactions on Electron Devices*, Vol. ED-25, No. 10, pp. 1185–1192 (Oct. 1978). Finally, it is desired that the dielectric layer(s) remaining after the anisotropic silicon etch be fairly rugged, in order to withstand further handling and processing of the wafer. In this connection, the total thickness of the dielectric layer should be at least about 0.5 μm and preferably at least about 1 μm.

The process of the invention employs photoresist, mask alignment, a dry etch plasma treatment, and anisotropic wet etching. Silicon dioxide and silicon nitride layers on the silicon wafer are used as the protective barrier layers.

As shown in FIG. 4b, one side 12a, called the unpolished side or the backside, of the wafer 12 is coated with a photoresist layer 28. This photoresist layer 28 is patterned and then developed to expose a portion 30 of the underlying dielectric layer 26. The exposed portions are etched away, such as with a conventional plasma or wet-etch process, to define the desired windows 30. $CF_4$ may be used in the dry-etching, but other forms of the gas are available for faster etching of the passivation layers while still protecting the silicon surface from overetch.

After completing the dry etch step, measurements may be taken, such as with a step profiler, to ensure complete removal of the layers. At this point, the photoresist 28 is removed from the substrate and the samples prepared for anisotropic etching. It should be noted that all processing to this point has been done on the unpolished side, or backside 12a, of the wafer 12.

Next, as depicted in FIG. 4c, an anisotropic etch is used to form tapered pyramidal shapes 18 through the silicon wafer 12 up to, but not through, the dielectric layer 26 on the frontside 12b of the wafer. These pyramidal shapes are the ink fill slots 18 described above.

This particular method of etching features in silicon is currently widely used in the semiconductor industry. KOH has been found to be a highly acceptable etchant for this purpose. The solution consists of an agitated $KOH:H_2O$ bath in a ratio of 2:1. The solution is heated to 85° C. and kept in the constant temperature mode.

<100> silicon etches as a rate of about 1.6 μm/minute in this solution, with the depth being controlled by pattern width. As is well-known, the etching slows substantially at a point where the <111> planes intersect, and the <100> bottom surface no longer exists.

The silicon wafers are immersed in the solution and remain so until completion of the etch cycle. The etching time depends on a variety of factors, including wafer thickness, etch temperature, etc.; for the example considered above, the etch time is about 5.5 to 6 hours. The most critical portion of this operation is in the last 30 minutes of etch time. Observation of the silicon is a must in order to stop etching when the $SiO_2$ windows 31 appear. The wafers are then removed from the etching solution at this point and placed in a water rinse, followed by a rinse/dryer application. Using an air or nitrogen gun is strongly discouraged at this point, since a thin membrane 31 of dielectric 26 covers the ink fill slot 18, and is required for continuity for the next sequence of steps.

The remaining head processing may now proceed. Thin film and photolithography masking are performed in the typical integrated circuit manufacturing fashion, but in contrast to the preceding process, is done on the polished, or frontside, of the wafer.

Specifically, a thin film 16 is then deposited on the dielectric layer 26 on the front surface 12b, as shown in FIG. 4d. This thin film is subsequently patterned to form the resistors 16, described above, as shown in FIG. 4e, using conventional techniques. (The associated conductor traces are not shown in the figure.) A passivating dielectric layer (not shown) may be applied over the resistors 16 and conductor traces.

Finally, that portion 31 of the dielectric layer 26 on the front surface 12b which covers the ink fill slot 18 is removed, so as to open up the ink fill slot. Etching (wet or dry), ultrasonics, laser drilling, air pressure, or the like may be employed to remove the membrane 31. Preferably, chemical etching of the dielectric membrane 31 is utilized, protecting the surface 12b with photoresist (not shown) and either etching from the backside 12a or patterning the photoresist to expose those portions 31 to be etched. Following etching, the photoresist layer is stripped away. FIG. 4f depicts the wafer following opening up of the ink fill slot 18. Alternatively, an air gun (not shown) generating an air blast may be used to open the ink fill slot 18.

Subsequently, layer 17 is formed on the major surface of the dielectric material 26 and openings therein to expose the resistor elements 16 to define the drop ejection chamber 15 and to provide the ink feed channel 14 from the resistor elements to a terminus region which fluidically communicates with the ink fill slot 18 for introducing ink from a reservoir to the drop ejection chamber 15. These additional steps are not depicted in the sequence of FIG. 4; reference may be had to FIG. 1 for the resulting structure.

Employing anisotropic etching in accordance with the teachings herein, the dimensions of the opening in the side corresponding to the entrance side of the etch is given by the dimensions of the opening of the corresponding exit side plus the wafer thickness times the square root of 2.

The frequency limit of a thermal ink-jet pen is limited by resistance in the flow of ink to the nozzle. Some resistance in ink flow is necessary to damp meniscus oscillation. However, too much resistance limits the upper frequency that a pen can operate. Ink flow resistance (impedance) is intentionally controlled by a gap adjacent the resistor 16 with a well-defined length and width. This gap is the ink feed channel 14, and its geometry is described elsewhere; see, e.g. , U.S. Pat. No. 4,882,595, issued to K. E. Trueba et al and assigned to the same assignee as the present application. The distance of the resistor 16 from the ink fill slot 18 varies with the firing patterns of the printhead.

An additional component to the impedance is the entrance to the ink feed channel 14, shown on the drawings at A. The entrance comprises a thin region between the orifice plate 22 and the substrate 12 and its height is essentially a function of the thickness of the barrier material 17. This region has high impedance, since its height is small, and is additive to the well-controlled intentional impedance of the gap 14 adjacent the resistor 16.

The distance from the ink fill slot 18 to the entrance to the ink feed channel 14 is designated the shelf. The effect of the length of the shelf on pen frequency can be seen in FIG. 5: as the shelf increases in length, the nozzle frequency decreases. The substrate 12 is etched in this shelf region to form extension 18a of the ink fill slot 18, which effectively reduces the shelf length and increases the cross-sectional area of the entrance to the ink feed channel 14. As a consequence, the impedance is reduced. In this manner, all nozzles have a more uniform frequency response. The advantage of the process of the invention is that the whole pen can now operate at a uniform higher frequency. In the past, each nozzle 20 had a different impedance as a function of its shelf length. With this variable eliminated, all nozzles have substantially the same impedance, thus tuning is simplified and when one nozzle is optimized, all nozzles are optimized. Previously, the pen had to be tuned for worst case nozzles, that is, the gap had to be tightened so that the nozzles lowest in impedance (shortest shelf) were not under-damped. Therefore, nozzles with a larger shelf would have greater impedance and lower frequency response.

Figure 5:
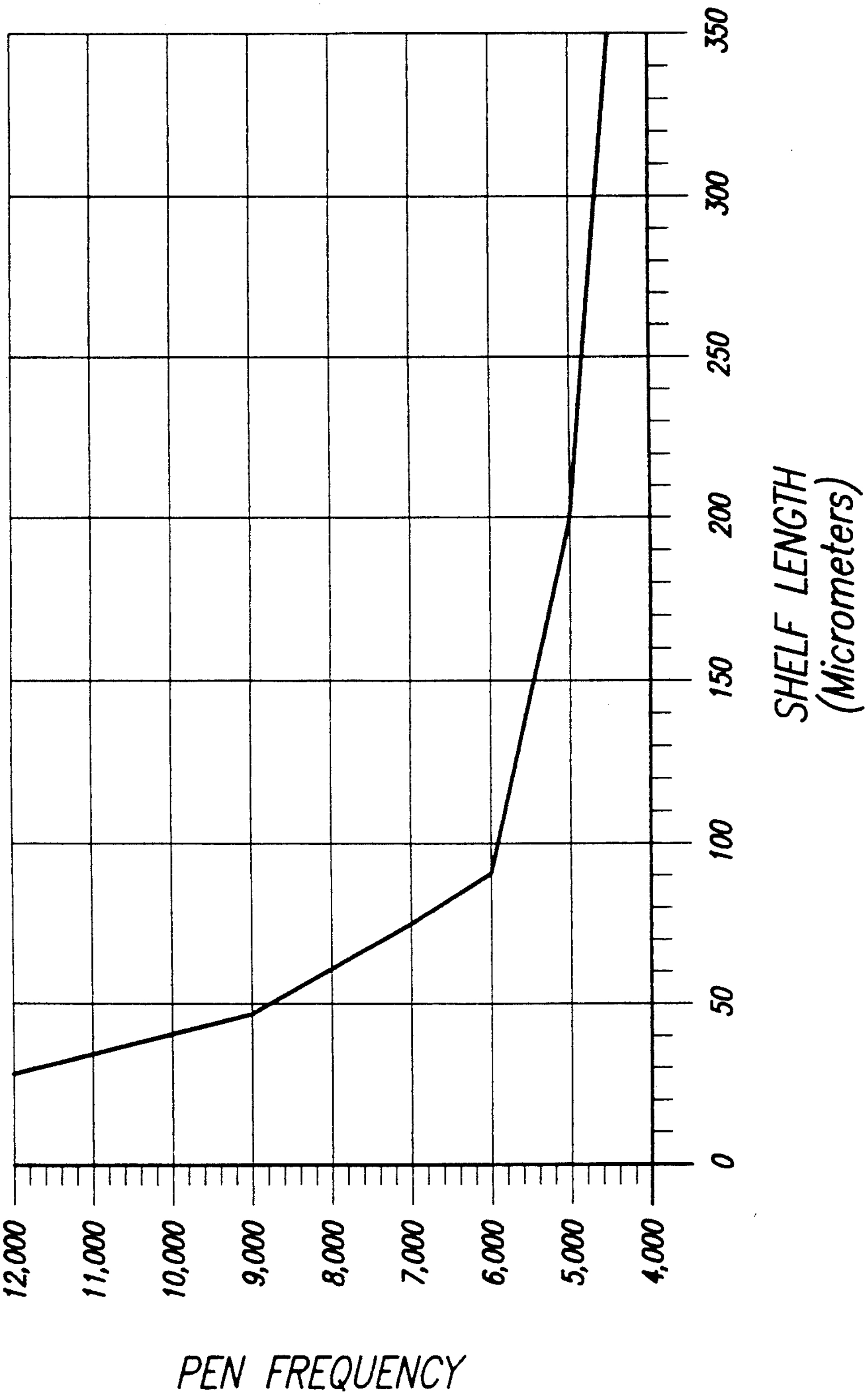
FIG. 5, on coordinates of pen frequency in Hertz and shelf length in micrometers, is a plot of the dependence of pen frequency as a function of shelf length for a specific drop volume case.

The curve shown in FIG. 5 has been derived from a pen ejecting droplets of about 130 pl volume. For this pen, a shelf length of about 10 to 50 μm is preferred for high operating frequency. For smaller drop volumes, the curves are flatter and faster.

FIG. 2 depicts the shelf length ($S_L$); the shelf is at a constant location on the die and therefore the $S_L$ dimension as measured from the entrance to the ink feed channel 14 varies somewhat due to resistor stagger.

INDUSTRIAL APPLICABILITY

The anisotropically etched silicon substrate providing improved ink flow characteristics is expected to find use in fabricating thermal ink-jet printheads.

Thus, there has been disclosed the fabrication of ink fill slots in thermal ink-jet printheads utilizing photochemical micromachining. It will be apparent to those skilled in this art that various changes and modifications of an obvious nature may be made without departing from the spirit of the invention, and all such changes and modifications are considered to fall within the scope of the invention, as defined by the appended claims.

What is claimed is:

1. A method for fabricating ink fill slots in thermal ink-jet printheads, comprising:

(a) providing a silicon substrate having a <100> or <110> crystallographic orientation and two opposed, substantially parallel major surfaces, defining a primary surface and a secondary surface;

(b) forming a passivating dielectric layer on both said major surfaces;

(c) exposing a portion of said secondary surface of said silicon substrate underlying said dielectric layer;

(d) anisotropically etching said exposed portion through said substrate to expose a portion of said dielectric layer on said primary surface to form said ink fill slot;

(e) forming and defining thin film resistor elements and conductive traces on said dielectric layer formed on said primary surface;

(f) removing said exposed portion of said dielectric layer on said primary surface overlying said ink fill slot; and (g) forming a layer on the major surface of said dielectric material and defining openings therein to expose said resistor elements to define a drop ejection chamber and to provide an ink feed channel from said resistor elements to a terminus region, said terminus region fluidically communicating with said ink fill slot for introducing ink from a reservoir to said drop ejection chamber.

2. The method of claim 1 further comprising providing a nozzle plate with nozzle openings, each nozzle opening operatively associated with a resistor element to define a firing element.

3. The method of claim 2 wherein said terminus region is provided with a pair of opposed projections formed in walls in said layer defining said ink feed channel and separated by a width to cause a constriction in said ink feed channel.

4. The method of claim 3 wherein each firing element is provided with lead-in lobes disposed between said projections and separating one ink feed channel from a neighboring ink feed channel.

5. The method of claim 4 wherein said ink fill slot extends to said lead-in lobes.

6. The method of claim 5 wherein said extended portion of said ink fill slot terminates at a substantially constant distance from the entrance to each said ink feed channel.

7. The method of claim 1 wherein said exposed portion of said dielectric layer on said primary surface overlying said ink fill slot is removed by chemical etching.

8. The method of claim 7 wherein a photoresist layer is deposited on said thin film resistor elements and said conductive traces and said exposed portion of said dielectric layer is removed by chemical etching through said openings in said silicon substrate.

9. The method of claim 7 wherein a photoresist layer is deposited on said thin film resistor resistors and said conductive traces, said photoresist layer is patterned and developed to form openings which uncover said exposed portion of said dielectric layer, and said exposed portion is removed by chemical etching through said openings in said photoresist layer.

10. The method of claim 1 wherein after forming and defining said thin film resistor elements and conductive traces, a passivating dielectric layer is formed thereover.

* * * * *